(12) United States Patent
Nicolaidis

(10) Patent No.: US 7,126,320 B2
(45) Date of Patent: Oct. 24, 2006

(54) EVALUATION OF THE CHARACTERISTICS OF ELECTRIC PULSES

(75) Inventor: Michael Nicolaidis, Saint Egreve (FR)

(73) Assignee: iROC Technologies, Grenoble (FR)

( * ) Notice: Subject to any disclaimer, the term of this patent is extended or adjusted under 35 U.S.C. 154(b) by 493 days.

(21) Appl. No.: 10/650,066

(22) Filed: Aug. 26, 2003

(65) Prior Publication Data

US 2004/0080343 A1    Apr. 29, 2004

(30) Foreign Application Priority Data

Aug. 29, 2002  (FR)  .................................. 02 10722
Mar. 27, 2003  (FR)  .................................. 03 03811

(51) Int. Cl.
*G01D 1/14* (2006.01)
(52) U.S. Cl. .................................... 324/76.13; 326/104
(58) Field of Classification Search ............ 324/76.13; 326/104; G01D 1/14
See application file for complete search history.

(56) References Cited

U.S. PATENT DOCUMENTS 6,697,209 B1*  2/2004  Hughes et al. ........... 360/77.14

OTHER PUBLICATIONS

French Search Report for application FR 0210722, FA 621673, dated May 28, 2003 citing US 5,675,265 A, US 6,144,262 A, US 6,233,205 B1, and US 6,219,305 B1.
French Search Report for application FR 0303811, FA 632315 dated Oct. 28, 2003 citing US 6, 400,650 B1 and US 2002/011865 A1.

* cited by examiner

*Primary Examiner*—R. Stephen Dildine
(74) *Attorney, Agent, or Firm*—Erwin J. Basinski

(57) ABSTRACT

A circuit for evaluating characteristics of duration and/or shape of an electric pulse induced in an element of an integrated circuit comprising an assembly of elements, each element being likely to receive an occasional external disturbance generating an electric pulse in the element, and a measurement circuit connected to the elements to determine said characteristics of an electric pulse generated in one of the elements.

19 Claims, 6 Drawing Sheets

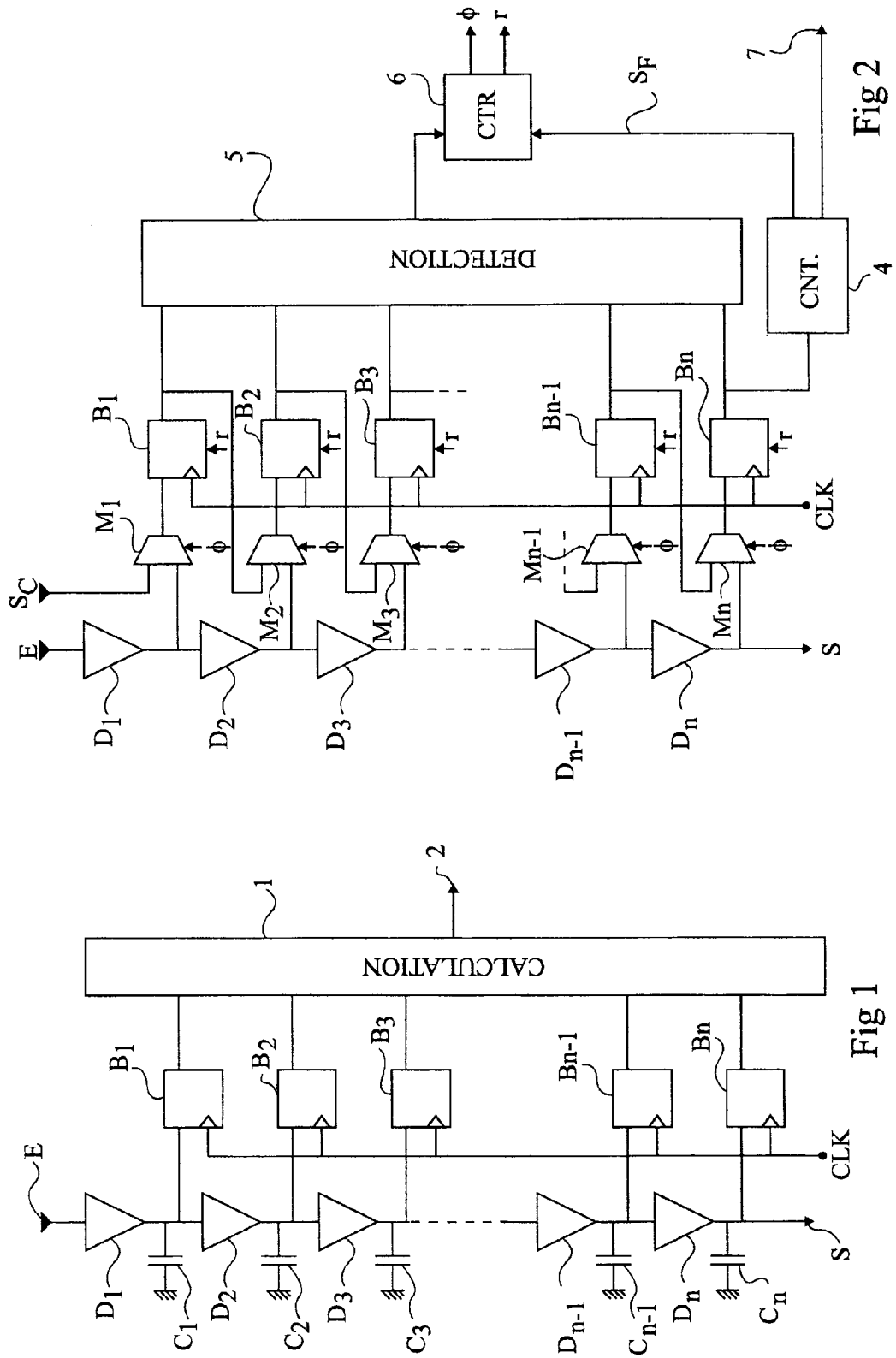

EVALUATION OF THE CHARACTERISTICS OF ELECTRIC PULSES

CROSS-REFERENCE TO RELATED APPLICATIONS

This application claims priority from the parent French applications, serial 02/10722 filed on Aug. 29, 2002, and serial 03/03811 filed on Mar. 27, 2003.

This application is related to the following issued patent and co-pending U. S. Applications:

U.S. Pat. No. 6,946,985 B2 issued Sept. 20, 2005 titled "Device for Reconfiguring a Faulty Storage Assembly."

U.S. patent application Ser. No. 10/268,686 filed Nov. 1, 2002, titled "Reconfiguration Device for a Faulty Memory." (51484000200)

U.S. patent application Ser. No. 09/936,032 filed Mar. 11,2002, titled "Logic Circuit Protected Against Transient Disturbances."

U.S. patent application Ser. No. 10/379,126 filed Mar. 3, 2003, titled "A Reconfiguration Device for a Faulty Memory."

U.S. patent application Ser. No. 10/492,294 filed Apr. 9, 2004, titled "Circuit Architecture Protected Against Perturbations."

U.S. patent application Ser. No. 10/494,080 filed Jul. 9,2004, titled "Data Storage Method with Error Correction."

BACKGROUND OF THE INVENTION

The present invention relates to the analysis of electric pulses induced in an integrated circuit receiving occasional external disturbances such as natural radiations.

More specifically, the present invention aims at providing a device of precise evaluation of the characteristics of an electric pulse induced in an element of an integrated circuit by an external disturbance, to more specifically evaluate its duration and/or its shape. Such a circuit element may for example be a transistor, an elementary logic circuit such as an OR gate, an AND gate, or an inverter, or any element of a cell library.

Knowing the duration or the shape of such electric pulses enables predicting by simulation the behavior of integrated circuits affected by such disturbances, to design integrated circuits having an operation less sensitive to external disturbances, and/or to provide adapted repair modes.

SUMMARY OF THE INVENTION

Thus, according to a first aspect, the present invention provides a circuit for evaluating characteristics of duration and/or shape of an electric pulse induced in an element of an integrated circuit comprising an assembly of elements, each element being likely to receive an occasional external disturbance generating an electric pulse in the element, and a measurement circuit linked to the elements to determine said characteristics of an electric pulse generated in one of the elements.

According to an alternative embodiment of such an evaluation circuit to evaluate the duration of a pulse generated in one of said elements, said elements form a chain of elements in series to propagate a pulse generated in one element through the next elements, the measurement circuit comprising storage means for storing at a given time the output levels of the elements; and a determination means for determining, based on the storage means, the number of elements indicating levels distinct from the idle level.

According to an alternative embodiment of the circuit for evaluating the duration of a pulse, the determination means indicates a duration equal to the number of elements indicating levels distinct from the idle level multiplied by the time of propagation through an element.

According to an alternative embodiment of the circuit for evaluating the duration of a pulse, the storage means are formed of flip-flops controlled by a same clock signal, the output of each circuit element being connected to the data input of a flip-flop, the data output of each flip-flop being connected to the determination means.

According to an alternative embodiment of the circuit for evaluating the duration of a pulse, the storage means are formed of flip-flops in series controlled by a same clock signal and of several multiplexers, the output of a flip-flop being connected to a first input of a multiplexer having its output connected to the data input of the next flip-flop, the second inputs of the multiplexers receiving the outputs of the circuit elements, the data output of the last flip-flop being connected to the determination means.

According to an alternative embodiment of the above-described circuit for evaluating the duration of a pulse, the circuit further comprises a detector circuit indicating whether no flip-flop, a single one, or several ones have switched state, and the data output of the last flip-flop is connected to a counter which counts the number of successive flip-flops, the stored levels of which are distinct from the idle levels, the counter receiving the stored levels in series when the multiplexers are set to have the stored levels pass from one flip-flop to another at the rate of the clock signal.

According to an alternative embodiment of the above-described circuit for evaluating the duration of a pulse, the circuit further comprises a control circuit which initially sets the multiplexers in a capture mode by connecting the outputs of the circuit elements to the data inputs of the flip-flops; sets the multiplexers in a counting mode to have the stored levels pass from one flip-flop to another when the detector circuit indicates that at least two flip-flops have switched state, and resets the multiplexers in capture mode when the counter indicates the end of the counting.

According to an alternative embodiment of the above-described circuit for evaluating the duration of a pulse, the circuit elements are non-inverting circuits and the flip-flops are set to level "0", and the detector circuit comprises two first OR gates, each first OR gate receiving one flip-flop data output out of two, the outputs of the first two OR gates entering a second OR gate and an AND gate, the control circuit receiving the outputs of the second OR gate and of the AND gate.

According to an alternative embodiment of the above-described circuit for evaluating the duration of a pulse, the circuit elements are inverter circuits and the flip-flops are set, half to level "0" and half to level "1", and the detector circuit comprises a first OR gate receiving the outputs of the flip-flops set to "0", and a first AND gate receiving the outputs of the flip-flops set to "1", the outputs of the first two gates entering a second OR gate and a second AND gate, the control circuit receiving the outputs of the second OR gate and of the second AND gate.

According to an alternative embodiment of the circuit for evaluating the duration of a pulse, the storage means are formed of groups of flip-flops controlled by a same clock signal, each group of flip-flops receiving the outputs of groups of circuit elements, the number of flip-flops being smaller than the number of circuit elements, the data output of each flip-flop being connected to the determination means.

According to a second aspect, the present invention also provides a circuit for evaluating the shape of a pulse generated in one of said elements, in which the elements are controlled so that a transistor comprised in each element is non-conductive, the drain or the source of a non-conductive transistor of each element being connected to a common node, the measurement circuit noting down the variations of the common node voltage when an external disturbance hits the drain or the source of a transistor connected to the common node.

According to an alternative embodiment of the circuit for evaluating the shape of a pulse, the circuit comprises an amplifier of the common node voltage and several flip-flops capable of storing the output voltage level of the amplifier, the flip-flops being controlled by an assembly of clocks offset with respect to one another.

According to an alternative embodiment of the circuit for evaluating the shape of a pulse, the circuit comprises an analog-to-digital converter of the common node voltage providing a digital value of the voltage over n bits, and several groups of binary flip-flops, each group of flip-flops comprising n flip-flops each capable of storing the value of one of the n bits, the groups being controlled by an assembly of clocks offset with respect to one another.

According to an alternative embodiment of the circuit for evaluating the shape of a pulse, the circuit comprises a load circuit capable of setting to order the common node to a given voltage.

According to an alternative embodiment of the circuit for evaluating the shape of a pulse, each transistor is connected to the common node by a connection, the connections being of same lengths.

According to an embodiment of the above-mentioned circuits for evaluating the shape of a pulse, the offset clocks are provided by a circuit comprising several chains of delay elements each receiving a clock signal, the first delay elements of each of the chains introducing different delays, the outputs of each of the elements of said chains providing said clocks.

The present invention also provides a method for evaluating duration and/or shape characteristics of an electric pulse induced in an integrated circuit element, comprising the steps of: forming a circuit comprising a great number of elements, each element being likely to receive an occasional external disturbance generating an electric pulse in the element; and determining, by means of a measurement device connected to the elements, said characteristics of an electric pulse generated in one of the elements.

According to an alternative of the method of the present invention consisting of evaluating the duration of a pulse generated in one of said elements, the step of forming a circuit comprises arranging a great number of circuit elements in series in an idle state, each circuit element being connected to propagate to the next circuit element a pulse provided by the preceding circuit element, and the determination step comprises periodically storing in storage means the output level of each circuit element and determining the number of storage means indicating levels distinct from the idle level.

According to an alternative of the method of the present invention consisting of evaluating the shape of a pulse generated in one of said elements, the circuit elements are controlled so that a transistor of each element is non-conductive, the drain or the source of a non-conductive transistor of each element being connected to a common node, and the determination step comprises measuring the variations of the common node voltage when an external disturbance hits the drain or the source of a transistor connected to the common node.

BRIEF DESCRIPTION OF THE DRAWINGS

The foregoing objects, features, and advantages of the present invention will be discussed in detail in the following non-limiting description of specific embodiments in connection with the accompanying drawings.

FIG. 1 is a diagram of a circuit for evaluating the duration of a pulse according to an embodiment of the present invention;

FIG. 2 is a diagram of a circuit for evaluating the duration of a pulse according to another embodiment of the present invention;

DETAILED DESCRIPTION

Figure 3:
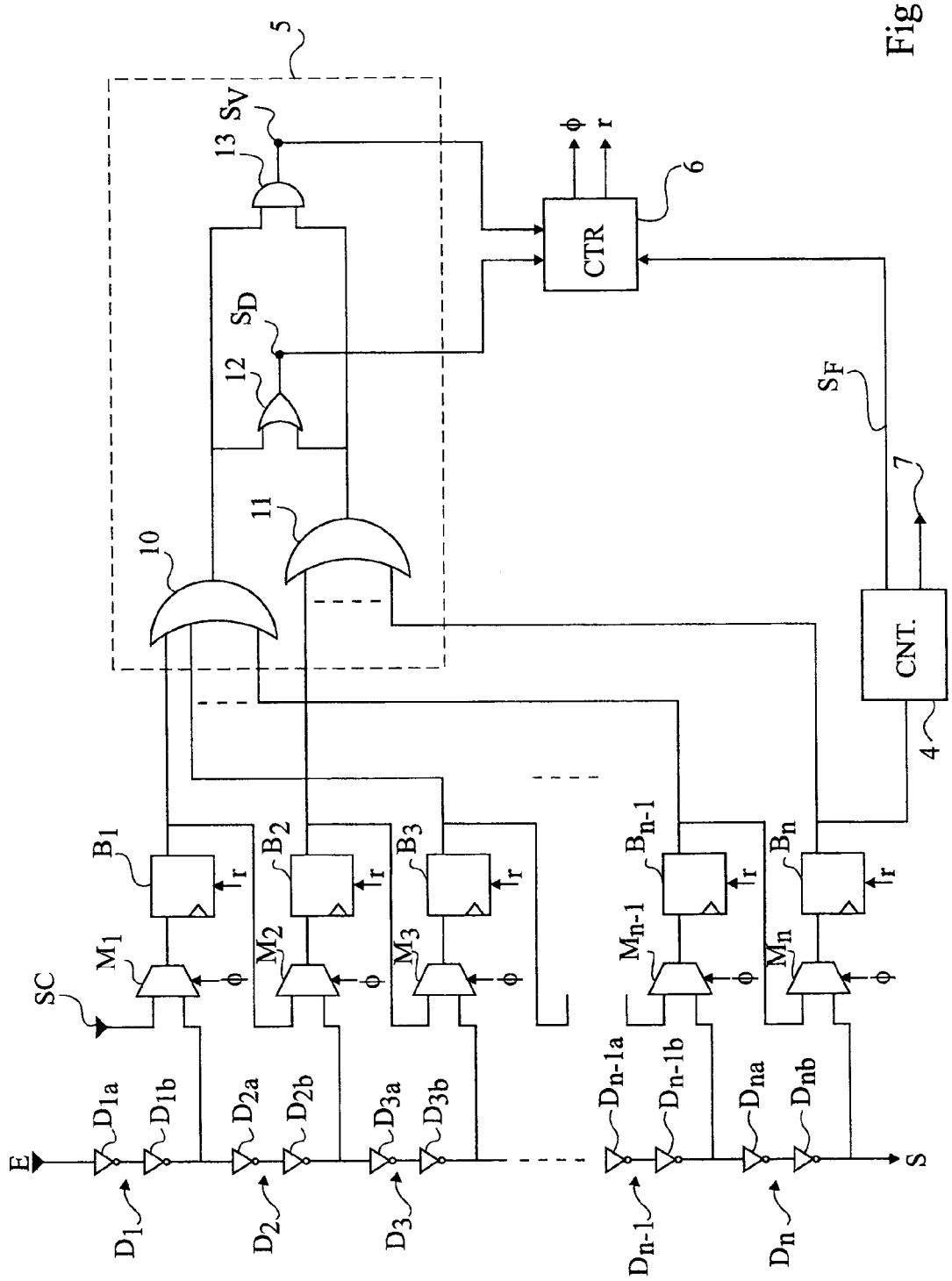
FIG. 3 is a more detailed diagram of the circuit of FIG. 2.

FIG. 1 is a diagram of a circuit for evaluating the duration of an electric pulse induced in a circuit element by an external element according to a first aspect of the present invention. The evaluation circuit, made in the form of an integrated circuit, comprises several circuit elements $D_1$ to $D_n$ in series between an input E and an output S. Each element of circuit $D_1$ to $D_n$ is connected to be able to propagate towards the next circuit element a pulse provided by the preceding circuit element. In the case, for example, where the circuit elements are two-input AND gates, each AND gate has an input connected to a fixed voltage equal to "1", an input connected to the output of the preceding AND gate, and an output connected to the next AND gate. Circuit elements $D_1$ to $D_n$ shown in FIG. 1 are non-inverting logic circuits. The fact that any element of an integrated circuit transmitting a signal imposes a delay to this signal is used in the present invention.

To be in conditions close to conditions of real use, circuit elements $D_1$ to $D_n$ may be connected to loads here represented in the form of capacitors $C_1$ to $C_n$ connected between the output of each circuit element and the ground.

The output of each circuit element $D_i$, i ranging between 1 and n, is connected to the data input of a flip-flop $B_i$. Flip-flops $B_1$ to $B_n$ are controlled by a same clock signal CLK. A calculation circuit 1 receives the levels stored in flip-flops $B_1$ to $B_n$ and provides on an output 2 the duration of the electric pulse.

Input E is permanently set to a determined level, for example, level "0". In the absence of an external disturbance, the output of each circuit element is equal to "0".

When a circuit element receives an external disturbance, its internal state is likely to be modified. The output of the "hit" circuit element switches state and switches, in the example, from level "0" to level "1". When the state of the hit circuit element becomes normal again, its output switches back to level "0". The hit circuit element thus generates an electric pulse, the duration of which is desired to be known.

The electric pulse propagates through the circuit elements placed after the hit circuit element, to the last circuit element $D_n$. During the propagation of the electric pulse, the number of circuit elements having an output at "1" at a given time depends on the delay imposed by each circuit element and the pulse duration.

At each rising edge of clock signal CLK, flip-flops $B_1$ to $B_n$ store the output level of each circuit element. The duration of the electric pulse is proportional to the number of levels "1" stored in flip-flops $B_1$ to $B_n$. Calculation circuit 1 counts the number k of flip-flops having a level "1" and provides on output 2 this number k in binary form. The propagation time of a circuit element is generally short and much shorter than the duration of an electric pulse induced by a disturbance. Number k is thus at least equal to two.

The duration of the measured electric pulse is thus equal to the measured number k multiplied by propagation time Tp of a circuit element $D_i$. The pulse duration more precisely ranges between (k−1)Tp and (k+1)Tp.

For such a pulse duration measurement to be performed, the propagation time of a circuit element must be known. This propagation time may be provided by the integrated circuit manufacturer, or be obtained by electric simulation (for example, with a SPICE simulator), or be measured by means of the circuit of the present invention. A pulse may for example be created on input E and the output level of each of the circuit elements may be measured at the rate of clock signal CLK, the period of which varies. When the levels "1" stored on two consecutive edges of the clock signal are shifted, in average, by more than one flip-flop, the period of clock signal CLK is larger than the propagation time of a circuit element. When the levels "1" stored on two consecutive edges of the clock signal are offset in average by less than one flip-flop, the period of clock signal CLK is shorter than the propagation time of a circuit element. By successive trials, the propagation time of a circuit element can be determined. Of course, other means may be implemented to measure this propagation time.

FIG. 2 shows an evaluation circuit according to another embodiment of the present invention. The evaluation comprises, as previously, several circuit elements $D_1$ to $D_n$ (possibly associated with loads not shown) in series between an input E and an output S. The output of each circuit element $D_i$ is connected to a first input of a multiplexer $M_i$. The output of each multiplexer $M_i$ is connected to the data input of a flip-flop $B_i$. The data output of each flip-flop $B_i$ is connected to the second input of multiplexer $M_{i+1}$. The second input of first multiplexer $M_1$ is connected to its first input or to a terminal SC which is drivable or set to level "0". The data output of last flip-flop $B_n$ is connected to a counter 4 (CNT). Flip-flops $B_1$ to $B_n$ are controlled by a clock signal CLK. Multiplexers $M_1$ to $M_n$ are controlled by a same selection signal Φ. The outputs of flip-flops $B_1$ to $B_n$ are connected to a detector circuit 5 which indicates to a control circuit CTR 6, at each rising edge of clock signal CLK, whether no flip-flop, a single one, or several ones have switched state.

Like for the evaluation circuit of FIG. 1, input E is permanently set to level "0". The outputs of circuit elements $D_1$ to $D_n$, which are non-inverting in this example, are at "0" in the absence of any external disturbance.

As long as detector circuit 5 indicates that no flip-flop has switched state, the control circuit provides the multiplexers with a selection signal Φ such that each multiplexer connects the output of a circuit element to the input of a flip-flop. The circuit then is in "capture" mode. Flip-flops $B_1$ to $B_n$ store at the rate of clock signal CLK the output level of each of the circuit elements.

When detector 5 indicates that a single flip-flop has switched state, the circuit is in the case where a multiplexer $M_i$ or a flip-flop $B_i$ has been hit by a disturbance. Control circuit 6 does not switch the state of selection signal Φ and may activate a reset signal r which resets flip-flops $B_1$ to $B_n$ to level "0".

When detector circuit 5 indicates that several flip-flops have switched state, the circuit is in the case where one circuit element has been hit. Control circuit 6 switches the state of selection signal Φ and it is switched to the "counting" mode. The output of each flip-flop $B_1$ to $B_n$ is connected to the input of the next flip-flop. At the rate of clock signal CLK, the levels stored in flip-flops $B_1$ to $B_n$ (a sequence of "0"s, a sequence of "1"s, and a sequence of "0"s) pass from one flip-flop to another and arrive in series into counter 4. Counter 4 is incremented for each received level "1". Preferably, counter 4 is stopped when the received levels become equal to "0". Counter 4 then provides on an output 7 the number of stored levels "1". Counter 4 activates an end-of-count signal $S_F$ which indicates to control circuit 6 that the circuit can switch back to the capture mode. Control circuit 6 controls a state switching of selection signal Φ to have the outputs of circuit elements $D_1$ to $D_n$ connected back to flip-flops $B_1$ to $B_n$ and activates reset signal r of flip-flops $B_1$ to $B_n$.

FIG. 3 shows the evaluation circuit diagram of FIG. 2, detailing detector circuit 5 and circuit elements $D_1$ to $D_n$.

Each circuit element $D_i$ is formed of two inverters in series $D_{ia}$ and $D_{ib}$. Detector circuit 5 comprises three OR gates 10, 11, 12, and one AND gate 13. OR gate 10 receives the output of the odd flip-flops, $B_1$, $B_3$, $B_5$, etc. OR gate 11 receives the output of the even flip-flops $B_2$, $B_4$, $B_6$, etc. OR gate 12 and AND gate 13 receive the outputs of OR gates 10 and 11. OR gate 12 provides control circuit 6 with a detection signal $S_D$. AND gate 13 provides control circuit 6 with an enable signal $S_V$.

Initially, flip-flops $B_1$ to $B_n$ are at level "0". The outputs of OR gates 10 and 11 are at "0", and signals $S_D$ and $S_V$ are zero.

When an external disturbance arrives onto a multiplexer $M_i$ or a flip-flop $B_i$, only the level stored in this flip-flop $B_i$ is modified. In this case, only one of the two OR gates 10 and 11 switches to "1". Signal $S_D$ then switches to "1" and signal $S_V$ remains at "0". Control circuit 6 activates reset signal r of flip-flops $B_1$ to $B_n$.

When an external disturbance arrives onto a circuit element, several consecutive flip-flops $B_1$ to $B_n$, at least two, store a "1" on the next edge of clock signal CLK. Both signals $S_D$ and $S_V$ switch to "1" and control circuit 6 switches the state of selection signal Φ to switch to the counting mode. Once the counting is over, control circuit 6 resets flip-flops $B_1$ to $B_n$ and the evaluation circuit switches back to the capture mode.

Of course, the present invention is likely to have various alterations, modifications, and improvements, which will readily occur to those skilled in the art. In particular, flip-flops $B_1$ to $B_n$ may be flip-flops which can be activated on a rising or falling edge or a level "1" or "0" of clock signal CLK. Further, those skilled in the art may provide other storage means. RAMs or SRAMs may for example be used.

In the case where the detection system is slow, it is possible for the pulse to originate from the chain of elements $D_1$ to $D_n$ in series. To avoid loosing the information stored in the flip-flops, according to an alternative of the present invention, a system for keeping their state is provided. In the case where the circuit elements are non-inverting, n two-input OR gates (not shown) may be added between circuit elements $D_1$ to $D_n$ and multiplexers $M_1$ to $M_n$, the output of each OR gate being connected to an input of a multiplexer and receiving the output of the circuit element initially connected to this multiplexer and the data output of the flip-flop to which this multiplexer is connected. Accordingly, once the flip-flops have switched to "1", they remain in this state at each clock cycle as long as signal Φ will not have connected them in series. In this case, the pulse to be detected must be found in the circuit elements at a position separate from its previous position at the next clock cycle. For this purpose, the clock period must be greater than the sum of the duration of the electric pulse and of the propagation time of a circuit element.

Further, it may be provided for the circuit elements to be inverting, for example, NAND gates, NOR gates, or mere inverters. The even flip-flops are set to a fixed level, for example, "0", and the odd flip-flops are set to a different fixed level, for example, "1". In this case, the detector circuit will comprise, not two OR gates 10 and 11, but one NAND gate connected to the data outputs of the even flip-flops and one OR gate connected to the data outputs of the odd flip-flops.

Of course, those skilled in the art, in their selection of the number of circuit elements and of the clock signal period, will take into account the minimum possible duration between two occurrences of disturbances, the propagation time of the used circuit elements, and the estimated duration of a pulse. The number of circuit elements must be sufficiently high for the probability of receiving a disturbance to be sufficiently high. Further, the clock signal period must be sufficiently short for the probability of missing a disturbance to be relatively small. There must also be time, in the minimum duration between two disturbances, to perform the above-described detection and counting operations.

Several chains of distinct circuit elements, of which the response to a disturbance is desired to be analyzed, may be placed on a same chip. A chain formed of various circuit elements in series may possibly be formed to use a common detection and measurement circuit.

Figure 4:
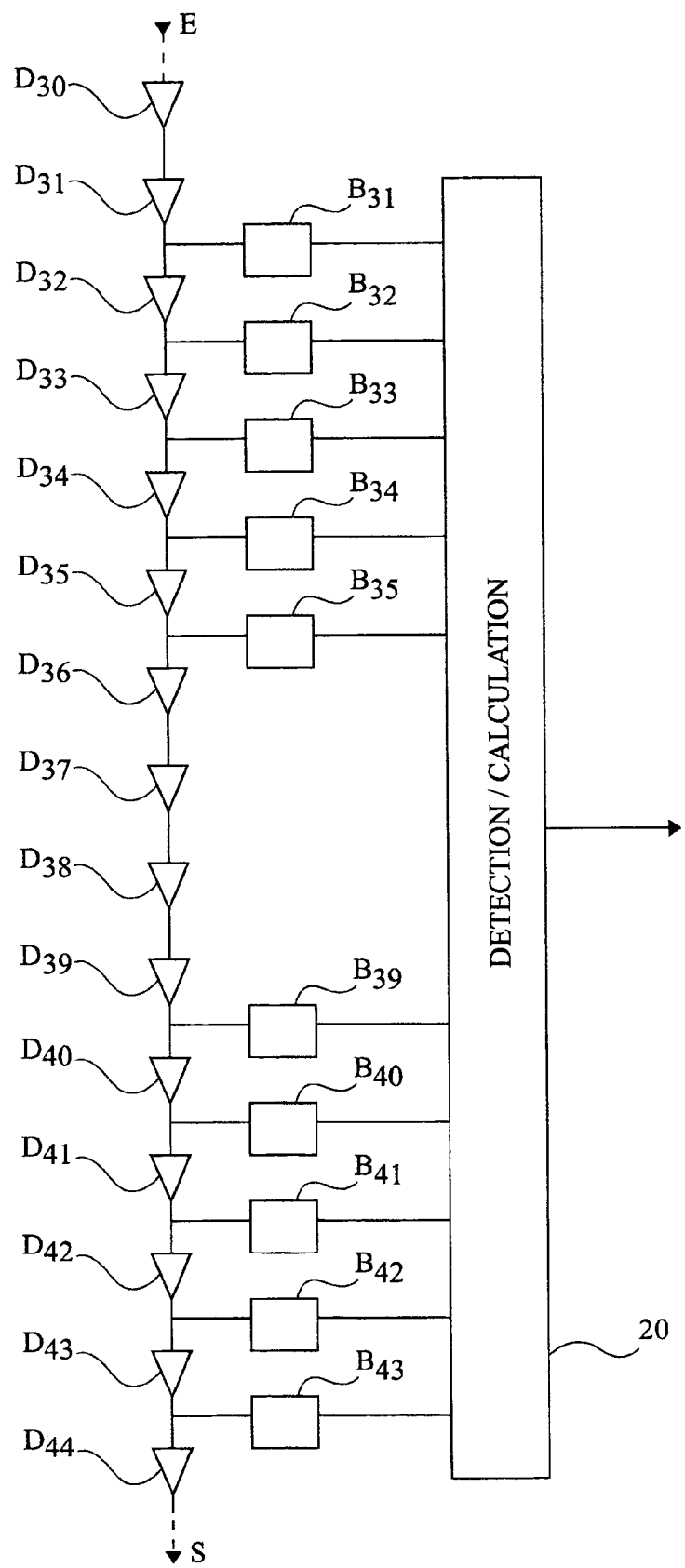
FIG. 4 is a diagram of a circuit for evaluating the duration of a pulse according to an alternative embodiment of the present invention.

FIG. 4 shows an evaluation circuit according to an alternative embodiment of the present invention. The evaluation circuit comprises, as previously, several circuit elements $D_1$ to $D_n$ in series between an input E and an output S. Only circuit elements $D_{30}$ to $D_{44}$ are shown in FIG. 4. Conversely to the evaluation circuit of FIG. 1, only certain groups of circuit elements in series are connected to flip-flops. In the example of FIG. 4, the outputs of circuit elements $D_{31}$ to $D_{35}$ are respectively connected to flip-flops $B_{31}$ to $B_{35}$. Similarly, the outputs of circuit elements $D_{39}$ to $D_{43}$ are connected to flip-flops $B_{39}$ to $B_{43}$. The outputs of circuit elements $D_{30}$, $D_{36}$ to $D_{38}$, $D_{44}$ are not connected to a flip-flop.

Like for the other previously described evaluation circuits, input E is permanently set at a given level, for example, "0". In the absence of external disturbances, the outputs of circuit elements $D_1$ to $D_n$ are set to a given level "0" or "1" according to whether the circuit elements are or not inverting. The flip-flops store the output level of the circuit elements to which they are connected on a rising or falling edge of a clock not shown.

When a circuit element receives an external disturbance, an electric pulse propagates from this circuit element to output S. When the electric pulse arrives onto a group of circuit elements connected to a flip-flop group on the active edge of the clock, the flip-flops switch state. Further, as previously, the evaluation circuit is preferably designed so that the minimum duration of a pulse corresponds to at least twice the propagation time of a circuit element. In other words, when an electric pulse propagates, at least two consecutive circuit elements switch state. Thus, when detection/calculation circuit 20 detects that at least two flip-flops of a group of flip-flops have switched state, the circuit calculates the number of flip-flops which have switched state to determine the pulse duration. The pulse duration is then equal, as previously, to the number of flip-flops having switched state multiplied by the propagation time of a circuit element. When detection/calculation circuit 20 detects that a single flip-flop has switched state, no calculation of the duration of the electric pulse is performed. It is indeed, as previously, possible for one of the flip-flops to have been hit by the disturbance. Further, it is possible that at the active edge of the clock signal, the electric pulse has just reached the first element of a group of circuit elements connected to a flip-flop group, or else that the electric pulse is leaving the last element of a group of circuit elements connected to a flip-flop group.

Further, when several flip-flops in a same group have switched state, including the first or the last flip-flop in the group, it is possible that at the time of the "capture" of the output levels of the circuit elements on an active edge of the clock, not all of the elements having switched state are connected to the analyzed flip-flop group. In this case, the measured duration is most likely shorter than the real duration of the electric pulse. To overcome this problem, it may be provided for detection/calculation circuit 20 to determine at the time of the detection of a state switching of the flip-flops whether the first or the last flip-flop in the concerned flip-flop group has switched state. If such is the case, detection/calculation circuit 20 does not calculate the duration of the electric pulse. To however avoid being in this case at each clock edge, the number k of flip-flops in a flip-flop group is preferably sufficiently large for the maximum duration of the electric pulse not to be greater than k times propagation time $D_C$ of a circuit element. Further, the clock signal has a high frequency so that there is a non-zero probability for the electric pulse to be "located" between the second and the k-th flip-flops of a flip-flop group on a clock edge. A way of making sure that the duration of an electric pulse is always measured is to provide an evaluation circuit such that:

$$k*D_c>T+2*P_w$$

where k is the number of flip-flops for each group, $D_c$ the propagation time of a circuit element, T the period of the clock signal, and $P_w$ the maximum duration of an electric pulse.

An advantage of the evaluation circuit according to the above-described alternative is that it enables reducing the surface area taken up by the flip-flops and the measurement/detection circuit.

To reduce the surface area to a maximum, it may be provided to place a single flip-flop group at the end of the chain of circuit elements.

Figure 5:
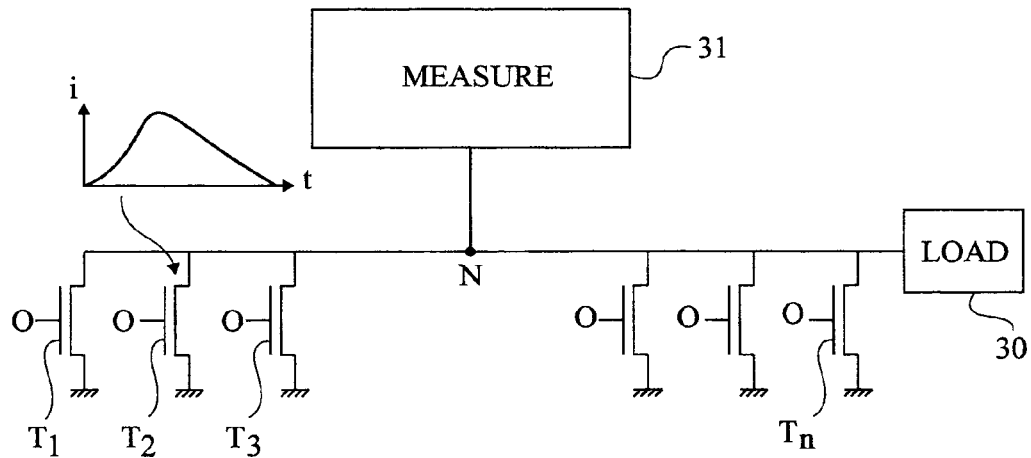
FIG. 5 is a diagram of a circuit for evaluating the shape of a pulse according to the present invention.

FIG. 5 is a diagram of a circuit for evaluating the shape of an electric pulse induced in a circuit element by an external disturbance according to the second aspect of the present invention. The evaluation circuit comprises several non-conductive transistors $T_1$ to $T_n$, the behavior of which is desired to be studied when a disturbance "hits" their drain. Transistors $T_1$ to $T_n$ are in this example NMOS transistors having their source connected to ground. The gates of transistors $T_1$ to $T_n$ are grounded so that the transistors are non-conductive. The drains of transistors $T_1$ to $T_n$ are connected to a common node N. A load circuit 30 (LOAD) and a measurement circuit 31 (MEASURE) are connected to node N. Transistors $T_1$ to $T_n$ may for example belong to n logic circuits, each formed of several transistors. In each logic circuit, the transistor, which is connected to the evaluation circuit, must be non-conductive. Thus, each logic circuit must be controlled so that the studied transistors $T_1$ to $T_n$ are non-conductive when they are not submitted to a disturbance. The non-conductive transistor, which is desired to be studied, may be connected to node N via another conductive transistor or possibly another component such as a resistor.

When activated, load circuit 30 biases node N to the ground voltage. When not activated, load circuit 30 is like disconnected from node N (its output is for example in high impedance). In the idle state, when waiting for a disturbance, both circuits are inactive. When an external disturbance "hits" the evaluation circuit at the level of one of the drains of transistors $T_1$ to $T_n$, a current appears in the transistor. As shown in FIG. 5, the current increases relatively fast, then decreases slower to become zero again. The connection between the "hit" transistor drain and measurement circuit 31 exhibits a given resistance R and a capacitance C, the values of which may be determined according to the shape and to the dimensions of the connection. The creation of a current in the hit transistor varies the voltage of common node N according to time constant RC of the connection between the hit transistor and node N. Knowing time constant RC, measurement circuit 31 determines the shape of the current in the hit transistor based on the shape of the voltage measured at node N. Once the measurement is over, load circuit 30 may be activated to make sure that the voltage at node N is equal to the desired idle voltage, the ground voltage in this example. Similarly, load circuit 30 may be activated at regular intervals.

Figure 6:
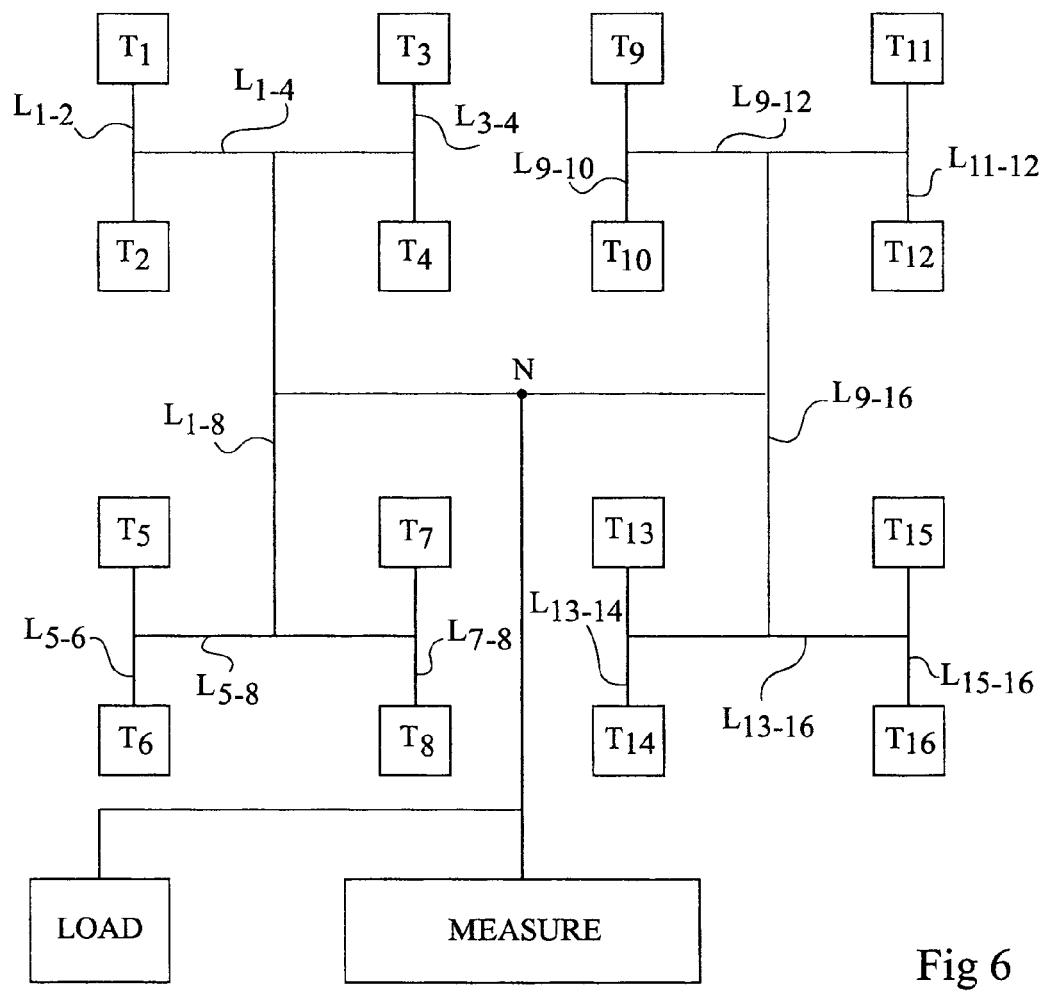
FIG. 6 is a diagram of a circuit for evaluating the shape of a pulse according to an alternative of the present invention.

FIG. 6 is an example of embodiment of the evaluation circuit of FIG. 5 in which the lengths of the connections between the drain of each transistors $T_1$ to $T_n$ and common node N are equal. The connections between node N and the drains of transistors $T_1$ to $T_n$ are made in the form of a tree, each branch of which divides up in two branches. In the example of FIG. 6, sixteen transistors $T_1$ to $T_{16}$ are connected to common node N. Transistors $T_1$ and $T_2$ are placed next to each other and their drains are connected by a connection $L_{1-2}$. Similarly, the pairs of transistors $T_3/T_4$, $T_5/T_6$, $T_7/T_8$, $T_9/T_{10}$, $T_{11}/T_{12}$, $T_{13}/T_{14}$, and $T_{15}/T_{16}$ are respectively connected by a connection $L_{3-4}$, $L_{5-6}$, $L_{7-8}$, $L_{9-10}$, $L_{11-12}$, $L_{13-14}$, and $L_{15-16}$. Connections $L_{1-2}$ to $L_{15-16}$ all have the same length. The middle of connection $L_{1-2}$ is connected to the middle of connection $L_{3-4}$ by a connection $L_{1-4}$. Similarly, connections $L_{5-6}/L_{7-8}$, $L_{9-10}/L_{11-12}$, $L_{13-14}/L_{15-16}$ are connected two by two by connections, respectively $L_{5-8}$, $L_{9-12}$, and $L_{13-16}$. Connections $L_{1-4}$, $L_{5-8}$, $L_{9-12}$, and $L_{13-16}$ have the same length. The middle of connection $L_{1-4}$ is connected to the middle of connection $L_{5-8}$ by a connection $L_{1-8}$. Similarly, the middle of connection $L_{9-12}$ is connected to the middle of connection $L_{13-16}$ by a connection $L_{9-16}$. Connections $L_{1-8}$ and $L_{9-16}$ have same lengths. The middle of connections $L_{1-8}$ and $L_{9-16}$ are connected to a common node by connections of same lengths.

It will be within the abilities of those skilled in the art to devise other connection networks enabling obtaining connections of identical lengths.

Figure 7:
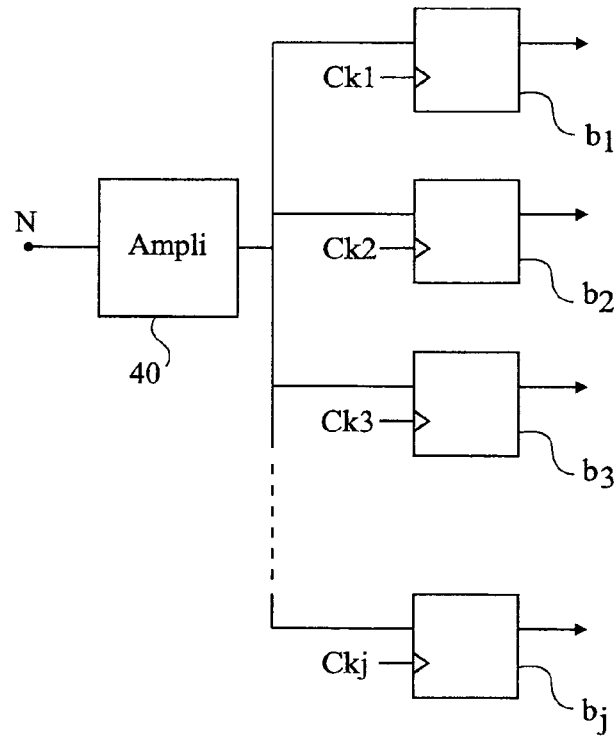
FIG. 7 is a diagram of an example of a measurement circuit of the evaluation circuit of FIG. 5.

FIG. 7 is a diagram of an embodiment of measurement circuit 31 of the evaluation circuit of FIG. 5. The measurement circuit comprises a voltage amplifier 40 having its input connected to common node N. The output of amplifier 40 is connected to j flip-flops $b_1$ to bj, where j is an integer. Flip-flops $b_1$ to $b_j$ are said to be "analog", meaning that the voltage levels stored by flip-flops $b_1$ to $b_j$ are "analog" levels conventionally ranging between the low and high flip-flop supply voltages. In the case, for example, where the flip-flops are supplied between 0 V and 3 V, a measured voltage level may be equal to 1 V. Each of flip-flops $b_1$ to $b_j$ is controlled by a clock signal Ck1 to Ckj. Clocks Ck1 to Ckj are offset with respect to one another. On one edge of clock Ck1, flop-flop $b_1$ stores the output voltage level of amplifier 40. At a next time, on the rising edge of clock Ck2, flip-flop $b_2$ stores the output level of amplifier 40. At the next times, on the edges of clocks Ck3 to Ckj, respectively, flip-flops $b_3$ to $b_j$ store the output level of amplifier 40.

The voltage levels stored in flip-flops $b_1$ to $b_j$ are periodically read by a processing device, not shown. The processing device reconstructs the shape of the output voltage of the amplifier, and thus of node N, from the read levels and the time offset between each of clocks Ck1 to Ckj. Further, the reading of flip-flops $b_1$ to $b_j$ may be triggered upon control of a pulse detection circuit. Further, the read levels may be stored in a RAM-type memory and subsequently recovered by the processing device.

Figure 8:
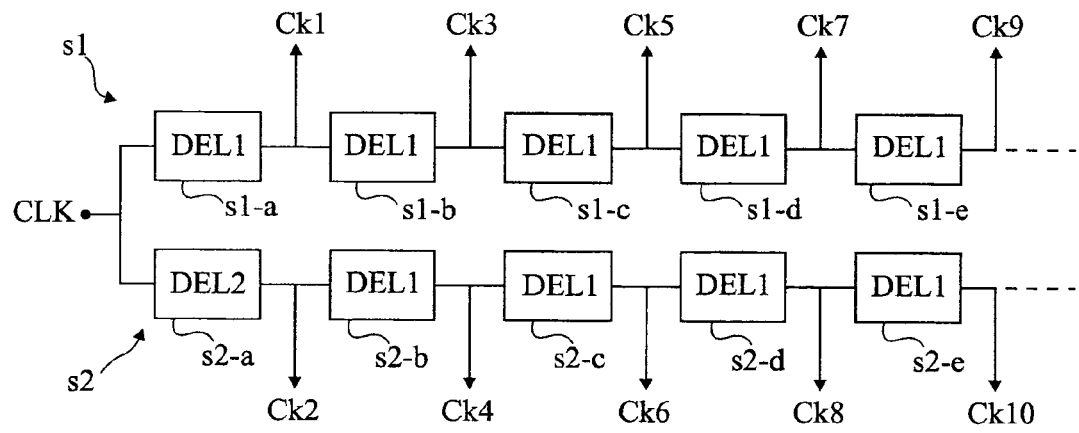
FIG. 8 is a diagram of a clock generation circuit used in the measurement circuit of FIGS. 7 and 9.

FIG. 8 is an example of a circuit enabling forming clocks Ck1 to Ckj of the measurement circuit of FIG. 7. The circuit comprises two chains of delay elements in series s1 and s2. The delay elements are for example non-inverting logic circuits such that the output signal is a copy of the input signal with a given delay. First chain s1 comprises delay elements s1-1 to s1-n, where n is an integer. Each delay element s1-1 to s1-n is identical and introduces a delay DEL1, for example, equal to 20 nanoseconds. Chain s2 comprises delay elements s2-1 to s2-m, where m is an integer. First delay element s2-1 of chain s2 introduces a delay DEL2 which is, for example, equal to 30 nanoseconds. All the other delay elements s2-2 to s2-m of chain s2 are delay elements identical to those of chain s1 and they introduce a delay DEL1. The inputs of both chains s1 and s2 are connected to a same clock signal CLK. The outputs of delay elements s1-1 to s1-n of chain s1 provide the "odd" clock signals Ck1, Ck3, Ck5 ... Ck(2n−1). The outputs of delay elements s2-1 to s2-e of chain s2 provide "even" clock signals Ck2, Ck4, Ck6 ... Ck(2m). The delay between two successive clocks is in this example equal to 10 nanoseconds. Generally, a clock generation circuit comprises several chains, the first delay elements of which introduce different delays in each of the chains. In the case where there exists a logic circuit exhibiting a delay shorter than or equal to the desired offset between two clocks, a single chain of delay elements may be used.

Figure 9:
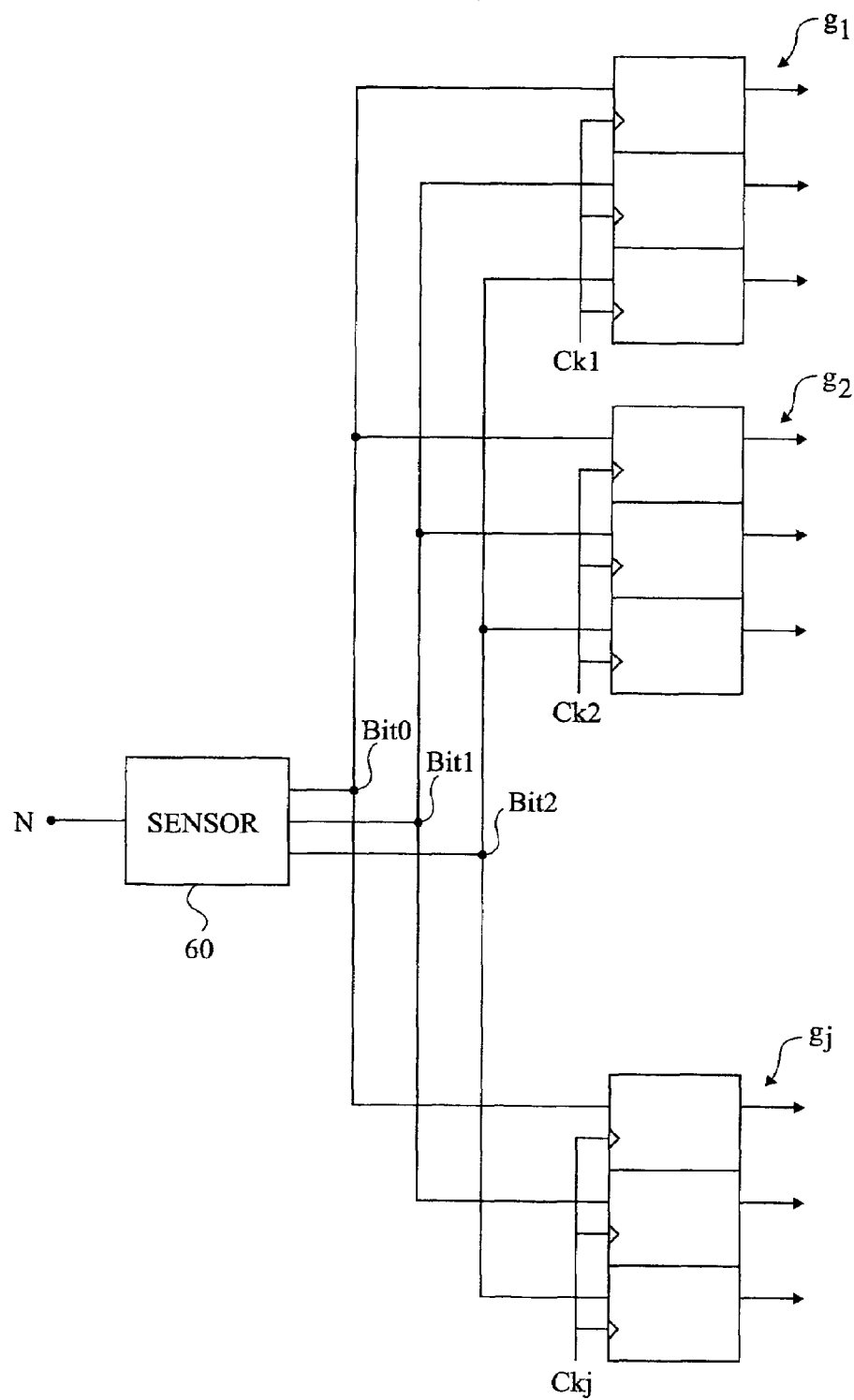
FIG. 9 is a diagram of another example of a measurement circuit of the evaluation circuit of FIG. 5.

FIG. 9 is a circuit of another example of measurement circuit 31 of the evaluation circuit of FIG. 5. The measurement circuit comprises an analog-to-digital converter (CAN) 60 which "digitizes" the voltage at node N. In the example of FIG. 9, the voltage level at node N is coded over three bits. The voltage at node N is then shown with eight different voltage levels. The digital value calculated by converter 60 is provided on three parallel outputs Bit0, Bit1, and Bit2. The circuit comprises j (binary) flip-flop groups $g_1$ to $g_j$, j being an integer. Each flip-flop group comprises in this example three flip-flops connected to converter 60 to store values "0" and "1" of outputs Bit0, Bit1, and Bit2. The i-th flip-flop group is controlled by a clock Cki, i varying between 1 and j. Clocks Ck1 to Ckj are offset with respect to one another and may be provided by a circuit such as described in relation with FIG. 8.

The values stored in the flip-flops are read by a processing device not shown. The processing device restores the shape of the voltage at node N based on the read digital values and on the time offset between each of clocks Ck1 to Ckj. As an alternative, the analog-to-digital converter may be replaced with a "threshold circuit" formed of several comparators, the output of which switches from "0" to "1" when the input voltage exceeds a given threshold and conversely, the comparators of the threshold circuit having different thresholds.

Of course, the circuit for evaluating the shape of an electric pulse according to the present invention is likely to have various alterations, modifications, and improvements which will readily occur to those skilled in the art. Further, it will be within the abilities of those skilled in the art to design other measurement circuits. Moreover, other circuits for generating offset clocks may be formed. Generally, the described elements of the evaluation circuits may be formed on a same integrated circuit or be partly formed on an integrated circuit and partly formed on an external device such as a computer.

Further, the method of the present invention may be implemented from an assembly of circuit elements gathered on a support other than an integrated circuit, such as a field programmable gate array (FPGA). Moreover, the means for determining the duration and/or the shape of a pulse generated in a circuit element may be of various types. They may belong to the circuit or be external to the circuit, and for example belong to a computer test device.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for evaluating duration or shape characteristics of an electric pulse induced in an element of an integrated circuit, comprising:
   an assembly of elements (D1 to Dn; d1 to dn), each element being likely to receive an occasional external disturbance generating an electric pulse in the element, wherein an element is an OR gate, an AND gate, an inverter or any element in a cell library; and
   a measurement circuit (B1 to Bn, 1; b1 to bn,) connected to the elements to determine said characteristics of an electric pulse generated in one of the elements.

2. The evaluation circuit of claim 1, for an evaluation of the duration of a pulse generated in one of said elements, wherein said elements form a chain of elements (D1 to Dn) in series to propagate a pulse generated in one element through the next elements, the measurement circuit comprising:
   storage means (B1 to Bn) for storing at a given time output levels of the elements; and
   a determination means for determining, based on the storage means, a number of elements indicating levels distinct from an idle level.

3. The evaluation device of claim 2, wherein the determination means indicate a duration equal to the number of elements indicating levels distinct from the idle level multiplied by a propagation time through an element.

4. The evaluation circuit of claim 2, wherein the storage means are formed of flip-flops (B1 to Bn) controlled by a same clock signal (CLK), an output of each circuit element (Di) being connected to a data input of a flip-flop (Bi), a data output of each flip-flop being connected to the determination means.

5. The evaluation circuit of claim 2, wherein the storage means are formed of flip-flops (B1 to Bn) in series controlled by a same clock signal (CLK) and of several multiplexers (M1 to Mn), an output of a flip-flop (Bi) being connected to a first input of a multiplexer (Mi) having its output connected to a data input of the next flip-flop (Bi+1), a second input of the multiplexers receiving the outputs of the circuit elements (D1 to Dn), the data output of the last flip-flop (Bn) being connected to the determination means.

6. The evaluation device of claim 5, further comprising a detector circuit indicating whether no flip-flop, a single one, or several ones have switched, and wherein the data output of the last flip-flop (Bn) is connected to a counter which counts a number of successive flip-flops stored levels of which are distinct from the idle levels, the counter receiving the stored levels in series when the multiplexers (M1 to Mn) are set to have the stored levels pass from one flip-flop to another at the rate of the clock signal (CLK).

7. The evaluation circuit of claim 6, further comprising a control circuit which:
   initially sets the multiplexers (M1 to Mn) in a capture mode by connecting the outputs of the circuit elements (D1 to Dn) to the data inputs of the flip-flops (B1 to Bn);
   sets the multiplexers in a counting mode to have the stored levels pass from one flip-flop to another when the detector circuit indicates that at least two flip-flops have switched state, and
   resets the multiplexers in capture mode when the counter indicates an end of the counting.

8. The evaluation circuit of claim 7, wherein the circuit elements (D1 to Dn) are non-inverting circuits and the flip-flops (B1 to Bn) are set to level "0", and wherein the detector circuit comprises two first OR gates, each first OR gate receiving one flip-flop data output out of two, the outputs of the first two OR gates entering a second OR gate and an AND gate, the control circuit receiving the outputs of the second OR gate and of the AND gate.

9. The evaluation circuit of claim 7, wherein the circuit elements (D1 to Dn) are inverter circuits and the flip-flops (B1 to Bn) are set, half to level "0" and half to level "1", and the detector circuit comprises a first OR gate receiving the outputs of the flip-flops set to "0", and a first AND gate receiving the outputs of the flip-flops set to "1", outputs of the first two gates entering a second OR gate and a second AND gate, the control circuit receiving outputs of the second OR gate and of the second AND gate.

10. The circuit of claim 2, wherein the storage means are formed of groups of flip-flops (B1 to Bn) controlled by a same clock signal, each group of flip-flops receiving outputs of groups of circuit elements, a number of flip-flops being smaller than the number of circuit elements, and data output of each flip-flop being connected to the determination means.

11. The circuit of claim 1, for evaluating the shape of a pulse generated in one of said elements, wherein the elements are controlled so that a transistor having a drain and a source (T1 to Tn) comprised in each element is non-conductive, the drain or the source of a non-conductive transistor of each element being connected to a common node (N), the measurement circuit measuring variations of the common node voltage when an external disturbance hits the drain or the source of a transistor connected to the common node.

12. The circuit of claim 11, comprising an amplifier of the common node voltage (N) and several analog flip-flops (b1 to bn) capable of storing an output voltage level of the amplifier, the flip-flops being controlled by an assembly of clocks (Ck1 to Ckj) offset with respect to one another.

13. The circuit of claim 11, comprising an analog-to-digital converter of the voltage at the common node (N) providing a digital value of the voltage over n bits (Bit1, Bit2, Bit3), and several groups of binary flip-flops (g1 to gj), each group of flip-flops comprising n flip-flops each capable of storing the value of one of the n bits, the groups being controlled by an assembly of clocks (Ck1 to Ckj) offset with respect to one another.

14. The circuit of claim 11, comprising a load circuit capable of setting to order the common node (N) to a given voltage.

15. The circuit of claim 11, wherein each transistor is connected to the common node by a connection, the connections being of same lengths.

16. The circuit of claim 12, wherein the offset clocks (Ck1 to Ckj) are provided by a circuit comprising several chains of delay elements (s1, s2) each receiving a clock signal,
the first delay elements (s1-1, s2-1) of each of the chains introducing different delays (DEL1, DEL2), the outputs of each of the elements of said chains providing said clocks.

17. A method for evaluating duration or shape characteristics of an electric pulse induced in an integrated circuit element, comprising the steps of:
forming a circuit comprising a plurality of elements, each element being likely to receive an occasional external disturbance generating an electric pulse in the element; wherein an element is an OR gate, an AND gate, an inverter or any element in a cell library; and
determining, by means of a measurement device connected to the elements, said characteristics of an electric pulse generated in one of the elements.

18. The method of claim 17 comprising evaluating the duration of a pulse generated in one of said elements, wherein the step of forming a circuit comprises arranging a plurality of circuit elements (D1 to Dn) in series in an idle state, each circuit element being connected to propagate to the next circuit element a pulse provided by an immediately preceding circuit element, and wherein the determination step comprises periodically storing in storage means the an output level of each circuit element and of determining a number of storage means indicating levels distinct from the idle level.

19. The method of claim 17 comprising evaluating the shape of a pulse generated in one of said elements, wherein the circuit elements are controlled so that a transistor of each element is non-conductive, the transistor having a drain and a source, and the drain or the source of a non-conductive transistor of each element being connected to a common node, and wherein the determination step comprises measuring variations of the common node voltage when an external disturbance hits the drain or the source of a transistor connected to the common node.

* * * * *